US012716774B2

(12) United States Patent
Wang et al.

(10) Patent No.: US 12,716,774 B2
(45) Date of Patent: Aug. 25, 2026

(54) MICRO LIGHT-EMITTING DIODE DETECTION SYSTEM AND DETECTION METHOD

(71) Applicant: JI HUA LABORATORY, Foshan (CN)

(72) Inventors: Wei Wang, Foshan (CN); Hai Bi, Foshan (CN); Jiangwei Duan, Foshan (CN); Heming Zhang, Foshan (CN); Lianbao Ke, Foshan (CN); Wanli Yang, Foshan (CN); Zhaoming He, Foshan (CN)

(73) Assignee: JI HUA LABORATORY, Foshan (CN)

( * ) Notice: Subject to any disclaimer, the term of this patent is extended or adjusted under 35 U.S.C. 154(b) by 262 days.

(21) Appl. No.: 18/577,539

(22) PCT Filed: Sep. 30, 2022

(86) PCT No.: PCT/CN2022/122977
§ 371 (c)(1),
(2) Date: Jan. 8, 2024

(87) PCT Pub. No.: WO2023/197537
PCT Pub. Date: Oct. 19, 2023

(65) Prior Publication Data

US 2024/0402012 A1 Dec. 5, 2024

(30) Foreign Application Priority Data

Apr. 11, 2022 (CN) ........................ 202210371679.X

(51) Int. Cl.
*G01J 3/28* (2006.01)
*G01J 3/02* (2006.01)
(Continued)

(52) U.S. Cl.
CPC ........... *G01J 3/2823* (2013.01); *G01J 3/0208* (2013.01); *G01M 11/0278* (2013.01); *G01R 31/2635* (2013.01); *G01J 2003/2826* (2013.01)

(58) Field of Classification Search
CPC .................. G01J 3/2823; G01J 3/0208; G01J 2003/2826; G01M 11/0278; G01R 31/2635
See application file for complete search history.

(56) References Cited

U.S. PATENT DOCUMENTS 11,150,189 B1 * 10/2021 Ke .................... G01N 21/6489
2010/0246936 A1 * 9/2010 Ji .......................... G06T 7/0004
382/149

(Continued)

FOREIGN PATENT DOCUMENTS

CN 108449972 A 8/2018
CN 111129057 A 5/2020

(Continued)

OTHER PUBLICATIONS

English machine translation of CN111610177A (Year: 2020).*

(Continued)

*Primary Examiner* — Dominic J Bologna
(74) *Attorney, Agent, or Firm* — Dority & Manning

(57) ABSTRACT

A micro light-emitting diode detection system includes: a first light generating module configured to send a first light signal to a plurality of micro light-emitting diodes to be detected, such that the plurality of micro light-emitting diodes to be detected generate second light signals, the first light signal including a laser signal; a hyperspectral camera configured to acquire the second light signals, to obtain a spectral imaging frame including spectral data of each of the plurality of micro light-emitting diodes to be detected; and a control module connected to the hyperspectral camera, and configured to determine, based on the spectral imaging (Continued)

frame, a defective micro light-emitting diode from the plurality of micro light-emitting diodes to be detected.

10 Claims, 3 Drawing Sheets

(51) Int. Cl.
*G01M 11/02* (2006.01)
*G01R 31/26* (2020.01)

(56) References Cited

U.S. PATENT DOCUMENTS

| | | | | |
|---|---|---|---|---|
| 2011/0156600 | A1 * | 6/2011 | Santo | G01R 31/2635 324/414 |
| 2015/0155445 | A1 | 6/2015 | Zhan et al. | |
| 2019/0004105 | A1 * | 1/2019 | Henley | H10H 20/857 |
| 2022/0230841 | A1 * | 7/2022 | Davies | H01J 37/228 |

FOREIGN PATENT DOCUMENTS

| | | | | |
|---|---|---|---|---|
| CN | 111443073 | A | 7/2020 | |
| CN | 111610177 | A * | 9/2020 | G01N 21/658 |
| CN | 112798234 | A | 5/2021 | |
| CN | 112798235 | A | 5/2021 | |
| CN | 113218628 | A | 8/2021 | |
| CN | 113514480 | A | 10/2021 | |
| CN | 113532641 | A | 10/2021 | |
| CN | 114235759 | A | 3/2022 | |
| CN | 114441149 | A | 5/2022 | |
| KR | 102286322 | B1 | 8/2021 | |

OTHER PUBLICATIONS

PCT International Search Report, mailed Dec. 27, 2022, and Written Opinion, mailed Dec. 23, 2022, (with English translations), for corresponding PCT Application No. PCT/CN2022/122977, 14 pages.
Chinese First Office Action for corresponding Chinese Application No. 202210371679.X, dated May 13, 2022, 15 pages.
Park et al., "In Operando Micro-Raman Three-Dimensional Thermometry with Diffraction-Limit Spatial Resolution for GaN-based Light-Emitting Diodes", Physical Review Applied, vol. 10, 8 pages.
Zuo-Jian et al., "A review of key technologies for epitaxy and chip process of micro light-emitting diodes in display application", (with English abstract), Acta Physica. Sinica, vol. 69, No. 19, 2020, 25 pages.

* cited by examiner

MICRO LIGHT-EMITTING DIODE DETECTION SYSTEM AND DETECTION METHOD

CROSS-REFERENCE TO RELATED APPLICATIONS

The present application is the national phase under 35 U.S.C. § 371 of PCT international application No. PCT/CN2022/122977, which has an international filing date of Sep. 30, 2022 and claims priority to Chinese patent application No. 202210371679.X, titled "MICRO LIGHT-EMITTING DIODE DETECTION SYSTEM AND DETECTION METHOD", filed with the China National Intellectual Property Administration on Apr. 11, 2022. The contents of the above identified PCT international application and Chinese patent application are incorporated herein in their entireties by reference for all purposes.

TECHNICAL FIELD

The present disclosure relates to the field of light-emitting diode detection, and in particular, to a micro light-emitting diode detection system and detection method.

BACKGROUND

Photoluminescence (PL) is the earliest detection method to be industrialized in the industry, which has the advantages of non-destructive and high efficiency. However, various PL detection equipment on the market cannot measure individual light-emitting diodes (LEDs) separately when detecting PL spectrum, resulting in a poor detection effect, and can only detect the spectrum of the entire field of view (FOV). When a defect occurs, further re-inspection is required at a smaller FOV to determine the specific defective LED. That is, the conventional technology can only detect the spectral data of one LED at a time, and the detection efficiency is low.

SUMMARY

The main objective of the present disclosure is to provide a micro light-emitting diode detection system and detection method, aiming to solve the technical problem of low detection efficiency of traditional PL detection equipment.

In order to achieve the above objective, the present disclosure provides a micro light-emitting diode detection system. The system includes a first light generating module, a hyperspectral camera and a control module.

The first light generating module is configured to send a first light signal to a plurality of micro light-emitting diodes to be detected, such that the plurality of micro light-emitting diodes to be detected generate second light signals, the first light signal including a laser signal;

The hyperspectral camera is configured to acquire the second light signals, to obtain a spectral imaging frame including spectral data of each of the plurality of micro light-emitting diodes to be detected.

The control module is connected to the hyperspectral camera, and configured to determine, based on the spectral imaging frame, a defective micro light-emitting diode from the plurality of micro light-emitting diodes to be detected.

The plurality of micro light-emitting diodes to be detected are self-excitable to generate the second light signals after receiving light energy in the first light signal.

In some embodiments, the system further includes a microscope objective, and a charge-coupled device camera connected to the control module.

The charge-coupled device camera is configured to acquire the second light signals passing through the microscope objective, and obtain, based on the second light signals, an image data frame. The image data frame includes identification point information of the plurality of micro light-emitting diodes to be detected. The identification point information includes position information of the plurality of micro light-emitting diodes to be detected.

The control module is further configured to determine, based on the image data frame, the defective micro light-emitting diode from the plurality of micro light-emitting diodes to be detected and the position information of the defective micro light-emitting diode.

In some embodiments, the system further includes a first semi-transparent and semi-reflective mirror placed between the microscope objective and the charge-coupled device camera, and a second semi-transparent and semi-reflective mirror placed between the first semi-transparent and semi-reflective mirror and the hyperspectral camera.

The first light generating module is configured to emit a first light beam to the plurality of micro light-emitting diodes to be detected through the first semi-transparent and semi-reflective mirror, such that the plurality of micro light-emitting diodes to be detected acquire, based on the first light beam, the first light signal, and generate second light beams.

The second light beams are reflected to, after the second light beams are emitted to the first semi-transparent and semi-reflective mirror through the microscope objective, the second semi-transparent and semi-reflective mirror through the first semi-transparent and semi-reflective mirror, and a part of the second light beams is reflected to the charge-coupled device camera through the second semi-transparent and semi-reflective mirror, such that the charge-coupled device camera acquires, based on the part of the second light beams, the second light signals, to obtain the image data frame.

A remaining part of the second light beams is transmitted from the second semi-transparent and semi-reflective mirror to the hyperspectral camera, such that the hyperspectral camera acquires, based on the remaining part of the second light beams, the second light signals, to obtain the spectral imaging frame.

In some embodiments, the system further includes a second light generating module, a charge-coupled device camera, and a carrier module connected to the hyperspectral camera and the charge-coupled device camera, respectively. A spatial resolution of the hyperspectral camera is less than or close to a size of the micro light-emitting diode to be detected.

The second light generating module is configured to send a third light signal to the plurality of micro light-emitting diodes to be detected.

The carrier module is configured to place the plurality of micro light-emitting diodes to be detected, and movable between a first position and a second position. The plurality of micro light-emitting diodes to be detected receive, at the first position, the first light signal, and generate the second light signals.

The charge-coupled device camera is configured to acquire the second light signals, and obtain, based on the second light signals, an image data frame.

The control module is further configured to send, after receiving the image data frame, a control instruction to the carrier module, such that the carrier module moves from the first position to the second position.

The plurality of micro light-emitting diodes to be detected receive, at the second position, the third light signal, and generate fourth light signals.

The hyperspectral camera is configured to acquire the fourth light signals, to obtain the spectral imaging frame. The spectral imaging frame includes the spectral data of the plurality of micro light-emitting diodes to be detected.

The control module is further configured to determine, based on the image data frame and the spectral imaging frame, the defective micro light-emitting diode from the plurality of micro light-emitting diodes to be detected and the position information of the defective micro light-emitting diode.

In some embodiments, the system further includes a first semi-transparent and semi-reflective mirror placed between the carrier module and the charge-coupled device camera, and a second semi-transparent and semi-reflective mirror placed between the carrier module and the hyperspectral camera.

The first light generating module is configured to reflect, at the first position, a first light beam to the plurality of micro light-emitting diodes to be detected through the first semi-transparent and semi-reflective mirror, such that the plurality of micro light-emitting diodes to be detected acquire, based on the first light beam, the first light signal, and generate second light beams.

The second light beams are emitted to the first semi-transparent and semi-reflective mirror, and the second light beams are transmitted from the first semi-transparent and semi-reflective mirror to the charge-coupled device camera, such that the charge-coupled device camera acquires, based on the second light beams, the second light signals, to obtain the image data frame.

The second light generating module is configured to reflect, at the second position, a third light beam to the plurality of micro light-emitting diodes to be detected through the second semi-transparent and semi-reflective mirror, such that the plurality of micro light-emitting diodes to be detected acquire, based on the third light beam, a third light signal, and generate fourth light beams.

The fourth light beams are emitted to the second semi-transparent and semi-reflective mirror, and the fourth light beams are transmitted from the second semi-transparent and semi-reflective mirror to the hyperspectral camera, such that the hyperspectral camera acquires, based on the fourth light beams, the fourth light signals, to obtain the spectral imaging frame.

In some embodiments, the control module is specifically configured to: determine, based on the spectral imaging frame, a plurality of dominant wavelengths corresponding to the spectral data of the plurality of micro light-emitting diodes to be detected; determine, by comparing the plurality of dominant wavelengths with a preset dominant wavelength, respectively, a plurality of dominant wavelength differences for the plurality of micro light-emitting diodes to be detected; determine, based on the image data frame, a plurality of brightness values of the plurality of micro light-emitting diodes to be detected; determine, by comparing the plurality of brightness values with a preset brightness value, respectively, a plurality of brightness differences for the plurality of micro light-emitting diodes to be detected; determine, based on the image data frame, whether there is an appearance defect in the plurality of micro light-emitting diodes to be detected; and determine, as the defective micro light-emitting diode, a micro light-emitting diode to be detected that satisfies at least one of that the dominant wavelength difference is greater than a preset dominant wavelength threshold, that the brightness difference is greater than a preset brightness threshold, or that there is the appearance defect, and determine the position information of the defective micro light-emitting diode corresponding to the identification point information of the defective micro light-emitting diode.

In some embodiments, the first light generating module includes a first laser emitter. A first condenser lens is coupled in front of an emission port of the first laser emitter, and a first beam expander is coupled behind the first condenser lens.

In some embodiments, the second light generating module includes a second laser emitter, and the third light signal includes a laser signal. A second condenser lens is coupled in front of an emission port of the second laser emitter, and a second beam expander is coupled behind the second condenser lens.

In some embodiments, the control module includes a device having a data processing function.

In some embodiments, the control module is configured to acquire, based on the spectral imaging frame, a plurality of spectral data corresponding to the plurality of micro light-emitting diodes to be detected; perform integral conversion on each of the plurality of spectral data, to obtain a plurality of brightness values of the plurality of micro light-emitting diodes to be detected; compare each of the plurality of brightness values with a preset brightness value, to obtain a brightness difference; determine whether the brightness difference is within a preset range; mark, if the brightness difference is not within of the preset range, the corresponding micro light-emitting diode to be detected as the defective micro light-emitting diode; determine, if the brightness difference is within the preset range, whether the spectral data of the corresponding micro light-emitting diode to be detected is abnormal using a convolutional neural network model; mark, if the spectral data of the corresponding micro light-emitting diode to be detected is abnormal, the corresponding micro light-emitting diode to be detected as the defective micro light-emitting diode.

In addition, the present disclosure further provides a micro light-emitting diode detection method. The method includes: acquiring, by means of a hyperspectral camera, a spectral imaging frame, the spectral imaging frame including spectral data of the plurality of micro light-emitting diodes to be detected; and determining, based on the spectral imaging frame, a defective micro light-emitting diode from the plurality of micro light-emitting diodes to be detected.

In some embodiments, the determining, based on the spectral imaging frame, the defective micro light-emitting diode from the plurality of micro light-emitting diodes to be detected, includes: acquiring, based on the spectral imaging frame, a plurality of spectral data of the plurality of micro light-emitting diodes to be detected; performing integral conversion on each of the plurality of spectral data, to obtain a plurality of brightness values of the plurality of micro light-emitting diodes to be detected; comparing each of the plurality of brightness values with a preset brightness value, to obtain a brightness difference; determining whether the brightness difference is within a preset range; marking, if the brightness difference is not within of the preset range, the corresponding micro light-emitting diode to be detected as the defective micro light-emitting diode; determining, if the brightness difference is within the preset range, whether the spectral data of the corresponding micro light-emitting diode to be detected is abnormal using a convolutional neural network model; and marking, if the spectral data of the corresponding micro light-emitting diode to be detected is abnormal, the corresponding micro light-emitting diode to be detected as the defective micro light-emitting diode.

In some embodiments, after the acquiring, by means of a hyperspectral camera, the spectral imaging frame, the method further includes: acquiring, by means of a charge-coupled device camera, an image data frame. The image data frame includes identification point information of the plurality of micro light-emitting diodes to be detected. The identification point information includes position information of the micro light-emitting diode to be detected.

The determining, based on the spectral imaging frame, the defective micro light-emitting diode from the plurality of micro light-emitting diodes to be detected, specifically includes: determining, based on the spectral imaging frame and the image data frame, the defective micro light-emitting diode from the plurality of micro light-emitting diodes to be detected and the position information of the defective micro light-emitting diode.

In some embodiments, the determining, based on the spectral imaging frame and the image data frame, the defective micro light-emitting diode from the plurality of micro light-emitting diodes to be detected, specifically includes: determining, based on the spectral imaging frame, a plurality of dominant wavelengths corresponding to the plurality of spectral data of the plurality of micro light-emitting diodes; determining, by comparing each of the plurality of dominant wavelengths with a preset dominant wavelength, respectively, a plurality of dominant wavelength differences corresponding to the plurality of micro light-emitting diodes; determining, based on the image data frame, a plurality of brightness values of the plurality of micro light-emitting diodes; determine, by comparing each of the plurality of brightness values with a preset brightness value, respectively, a plurality of brightness differences corresponding to the plurality of micro light-emitting diodes; determining, based on the image data frame, whether there is an appearance defect in the plurality of micro light-emitting diodes; and determining, as the defective micro light-emitting diode, a micro light-emitting diode to be detected that satisfies at least one of that the dominant wavelength difference is greater than a preset dominant wavelength threshold, that the brightness difference is greater than a preset brightness threshold, or that there is the appearance defect, and determining the position information of the defective micro light-emitting diode corresponding to the identification point information of the defective micro light-emitting diode.

Embodiments of the present disclosure provide a micro light-emitting diode detection system and detection method. The system includes: a first light generating module configured to send a first light signal to a plurality of micro light-emitting diodes to be detected, such that the plurality of micro light-emitting diodes to be detected generate second light signals; a hyperspectral camera configured to acquire the second light signals, to obtain a spectral imaging frame, the spectral imaging frame including spectral data of each of the plurality of micro light-emitting diodes to be detected; and a control module connected to the hyperspectral camera, and configured to determine, based on the spectral imaging frame, a defective micro light-emitting diode from the plurality of micro light-emitting diodes to be detected.

Since the resolution of a hyperspectral camera can be smaller than or close to the size of the micro light-emitting diode, the present disclosure can simultaneously acquire light signals of a plurality of micro light-emitting diodes to be detected through the hyperspectral camera to obtain a spectral imaging frame. Then, spectral data of each of the micro light-emitting diodes to be detected in the spectral imaging frame is analyzed to achieve accurate detection of the plurality of micro light-emitting diodes at the same time, which improves the detection efficiency of micro light-emitting diodes in production.

DETAILED DESCRIPTION OF THE EMBODIMENTS

Figure 1:
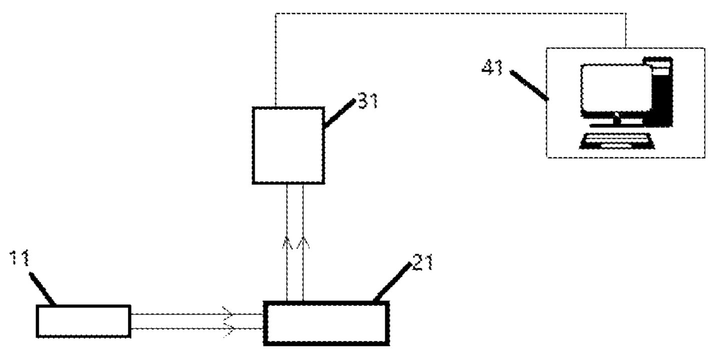
FIG. 1 is a schematic diagram illustrating a configuration of a micro light-emitting diode detection system according to a first embodiment of the present disclosure.

In order to clearly understand the objectives, functional features and advantages of the present disclosure, the present disclosure will further describe the embodiments of the present application with reference to the accompanying drawings. It should be understood that the specific embodiments described here are only used to explain the present disclosure and are not intended to limit the present disclosure.

The main solutions of the embodiments of the present disclosure are as follows. A micro light-emitting diode detection system includes a first light generating module, a hyperspectral camera, and a control module. The first light generating module is configured to send a first light signal to a plurality of micro light-emitting diodes to be detected, such that the plurality of micro light-emitting diodes to be detected generate second light signals. The hyperspectral camera is configured to acquire the second light signals, to obtain a spectral imaging frame. The spectral imaging frame includes spectral data of each of the plurality of micro light-emitting diodes to be detected. The control module is connected to the hyperspectral camera, and configured to determine, based on the spectral imaging frame, a defective micro light-emitting diode from the plurality of micro light-emitting diodes to be detected.

The traditional micro light-emitting diode (Micro-LED) technology is not yet mature, and the biggest bottlenecks are cost and yield, which are also the biggest factors affecting the large-scale commercialization of Micro-LED display technology. The calculation of yield is based on stable and reliable detection technology. Without highly repeatable detection equipment, calculating yield is meaningless. Therefore, massive detection technology also needs the attention and focus of the industry. Micro-LED application products use a large number of chips, and the optical and electrical properties of Micro-LED modules need be determined accurately and quickly. Massive detection is required to reduce detection time and cost. How to quickly and accurately test good products is a major problem in the manufacturing process, and it is also one of the main reasons for the bottleneck of Micro-LED detection technology at this stage. Photoluminescence (PL) is the earliest detection method to be industrialized in the industry and has the advantages of non-destructive and high efficiency. However, various PL detection equipment on the market cannot measure individual light-emitting diodes (LEDs) separately when detecting PL spectrum, resulting in a poor detection effect, and can only detect the spectrum of the entire field of view (FOV). When a defect occurs, further re-inspection is required at a smaller FOV to determine the specific defective LED. This method essentially can only detect the spectral data of one LED at a time, and the detection speed is slow.

The present disclosure provides a solution. Since the resolution of a hyperspectral camera can be smaller than or close to the size of the micro light-emitting diode, the present disclosure can simultaneously acquire light signals of a plurality of micro light-emitting diodes to be detected through the hyperspectral camera to obtain a spectral imaging frame. Then, spectral data of each of the micro light-emitting diodes to be detected in the spectral imaging frame is analyzed to achieve accurate detection of the plurality of micro light-emitting diodes at the same time, which improves the detection efficiency of micro light-emitting diodes in production.

Referring to FIG. 1, FIG. 1 is a schematic diagram illustrating a configuration of a micro light-emitting diode detection system according to a first embodiment of the present disclosure. The system includes a first light generating module 11, a hyperspectral camera 31, and a control module 41.

The first light generating module 11 is configured to send a first light signal to a plurality of micro light-emitting diodes 21 to be detected, such that the plurality of micro light-emitting diodes 21 to be detected generate second light signals.

The plurality of micro light-emitting diodes 21 to be detected are self-excitable to generate the second light signals after receiving light energy in the first light signal.

The first light generating module 11 may include a laser emitter. The first light signal may include a laser signal.

In some embodiments, the first light generating module 11 sends the first light signal to the micro light-emitting diode 21 to be detected, and the micro light-emitting diode 21 to be detected obtains the light energy in the first light signal, thereby generating and emitting the second light signal.

The hyperspectral camera 31 is configured to acquire the second light signals to obtain a spectral imaging frame. The spectral imaging frame includes spectral data of the plurality of micro light-emitting diodes 21 to be detected.

The hyperspectral camera 31 converts the light signals into the spectral imaging frame using a camera imaging principle. It can be understood that since the resolution of the hyperspectral camera 31 is smaller than or close to the size of the micro light-emitting diode 21, the spectral imaging frame may include the spectral data of the plurality of micro light-emitting diodes 21 to be detected.

The control module 41 is connected to the hyperspectral camera 31, and configured to determine a defective micro light-emitting diode from the plurality of micro light-emitting diodes 21 to be detected based on the spectral imaging frame.

The control module may include a device having a data processing function, such as a computer, a laptop, or the like.

Specifically, the control module 41 may determine the defective micro light-emitting diode through the following detection method. The control module 41 may be configured to acquire, based on the spectral imaging frame, the spectral data of the plurality of micro light-emitting diodes 21 to be detected; perform integral conversion on the spectral data of each of the plurality of micro light-emitting diodes 21 to be detected, to obtain a brightness value of the micro light-emitting diode 21 to be detected; compare the brightness value of this micro light-emitting diode 21 to be detected with a preset brightness value, to obtain a brightness difference; determine whether the brightness difference is within a preset range; mark, if the brightness difference is not within of the preset range, this micro light-emitting diode 21 to be detected as the defective micro light-emitting diode; determine, if the brightness difference is within the preset range, whether the spectral data of this micro light-emitting diode 21 to be detected is abnormal using a convolutional neural network model; mark, if the spectral data of this micro light-emitting diode 21 to be detected is abnormal, this micro light-emitting diode 21 to be detected as the defective micro light-emitting diode.

In this embodiment, the micro light-emitting diode detection system includes the first light generating module, the hyperspectral camera, and the control module. The first light generating module is configured to send the first light signal to the plurality of micro light-emitting diodes to be detected, such that the plurality of micro light-emitting diodes to be detected generate the second light signals. The hyperspectral camera is configured to acquire the second light signals to obtain the spectral imaging frame. The spectral imaging frame includes the spectral data of the plurality of micro light-emitting diodes to be detected. The control module is connected to the hyperspectral camera, and configured to determine the defective micro light-emitting diode from the plurality of the micro light-emitting diodes to be detected based on the spectral imaging frame.

Since the resolution of a hyperspectral camera can be smaller than or close to the size of the micro light-emitting diode, the present disclosure can simultaneously acquire light signals of a plurality of micro light-emitting diodes to be detected through the hyperspectral camera to obtain a spectral imaging frame. Then, spectral data of each of the micro light-emitting diodes to be detected in the spectral imaging frame is analyzed to achieve accurate detection of the plurality of micro light-emitting diodes at the same time, which improves the detection efficiency of micro light-emitting diodes in production.

Figure 2:
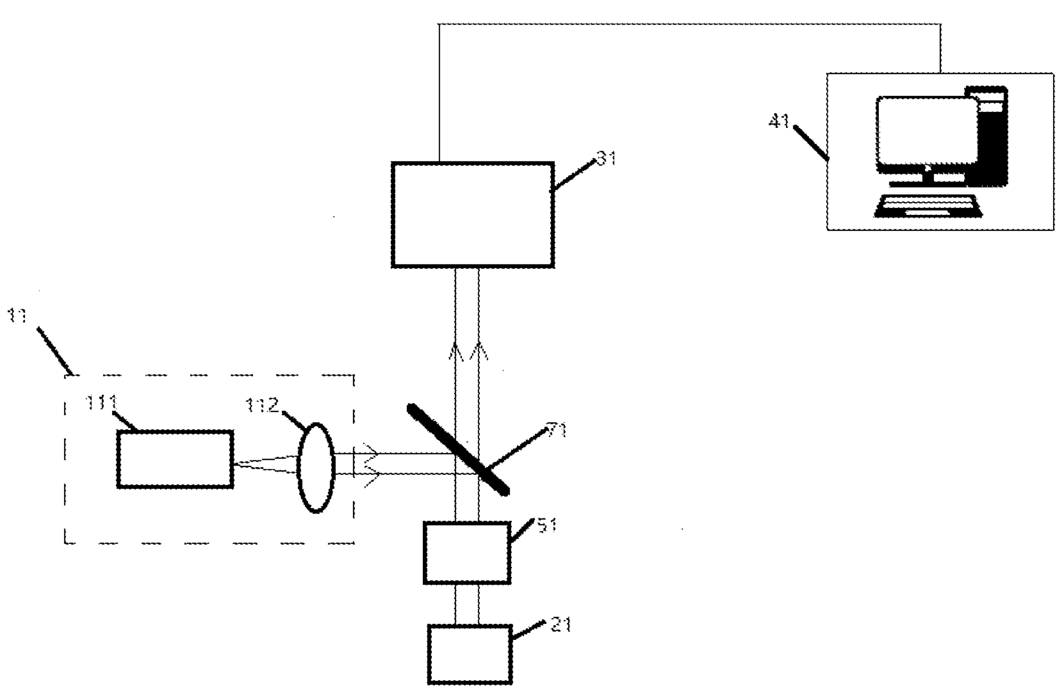
FIG. 2 is a schematic diagram illustrating a configuration of a micro light-emitting diode detection system according to a second embodiment of the present disclosure.

Based on the above embodiments, since the defects of the micro light-emitting diode include not only a spectral abnormality and a brightness abnormality, but also an appearance defect, and the appearance defect cannot be determined from the spectral data alone, an embodiment of the present disclosure provides another micro light-emitting diode detection system. Referring to FIG. 2, FIG. 2 is a schematic diagram illustrating a configuration of a micro light-emitting diode detection system according to a second embodiment of the present disclosure.

In this embodiment, the micro light-emitting diode detection system further includes a high-magnification microscope objective 51 placed between the hyperspectral camera 31 and the plurality of micro light-emitting diodes 21 to be detected.

Figure 3:
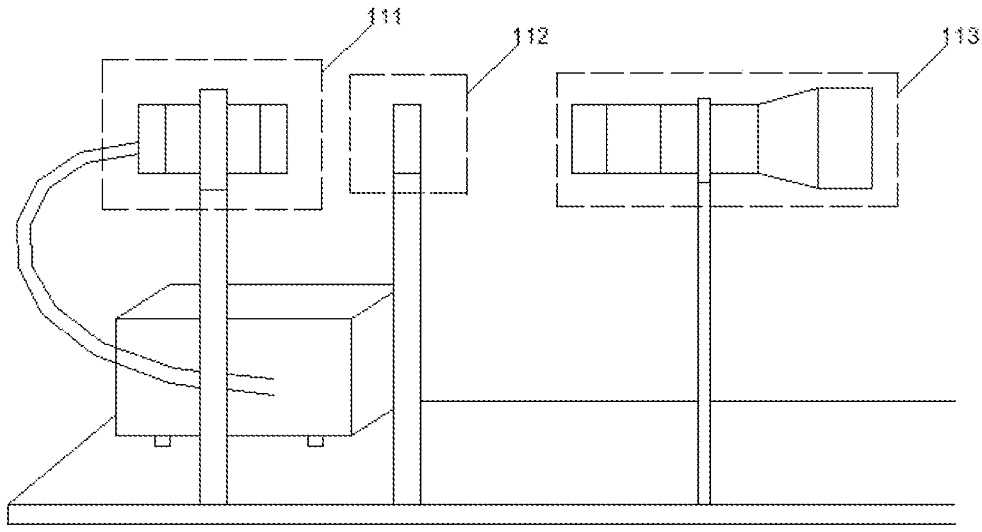
FIG. 3 is a schematic diagram illustrating a configuration of a first light generating module of the present disclosure.

In some embodiments, referring to FIG. 3, FIG. 3 is a schematic diagram illustrating a configuration of a first light generating module of the present disclosure. The first light generating module 11 may include a first laser emitter 111.

It can be understood that since the light emitted by the laser emitter generally has a divergence angle, in order to converge the light signals to achieve convergence of light energy, a first condenser lens 112 may be coupled in front of an emission port of the laser emitter.

It should be noted that a light spot generated by the light signal after passing through the first condenser lens 112 will be smaller than the FOV. In order to enable all the micro light-emitting diodes 21 to be detected in the FOV to obtain the first light signal, on the premise that the light energy is satisfied, a first beam expander 113 may be coupled behind the first condenser lens 112, so that all the micro light-emitting diodes 21 to be detected in the FOV can obtain the first light signal.

The high-magnification microscope objective 51 may be configured to enlarge the image size of the micro light-emitting diode 21 to ensure that the hyperspectral camera 31 may still acquire a relatively clear image data frame of the micro light-emitting diode 21 even if the resolution is insufficient.

The hyperspectral camera 31 is further configured to acquire the second light signals passing through the high-magnification microscope objective 51, to obtain an image data frame and the spectral imaging frame. The image data frame includes identification point information of the plurality of micro light-emitting diodes 21 to be detected.

The identification point information includes position information of the micro light-emitting diode 21 to be detected.

It can be understood that the hyperspectral camera 31 also has the function of acquiring image data. However, due to insufficient resolution of the hyperspectral camera 31, the image data actually acquired is not clear enough. As an optional embodiment, a high-magnification microscope objective 51 may be placed between the hyperspectral camera 31 and the plurality of micro light-emitting diodes 21 to be detected, so that the hyperspectral camera 31 may acquire clear image data of the micro light-emitting diode 21 to be detected.

In some embodiments, there is an identification point on the micro light-emitting diode 21 to be detected, which are used to correct the spectral data of the micro light-emitting diode 21 to be detected and determine the position information of the micro light-emitting diode to be detected.

The control module 41 is further configured to determine the defective micro light-emitting diode and the position information of the defective micro light-emitting diode from the plurality of micro light-emitting diodes 21 to be detected based on the image data frame.

Specifically, in this embodiment, as an optional implementation, the control module 41 may detect the micro light-emitting diodes to be detected using the following detection method, to determine the defective micro light-emitting diode.

The control module 41 may correct the spectral data in the spectral imaging frame based on the identification point.

It can be understood that the spectral data emitted by the micro light-emitting diode 21 in different orientations will be different. In order to make the detection results more accurate, specifically, the control module 41 determines an orientation of the current micro light-emitting diode to be detected by identifying the identification point on the micro light-emitting diode 21 to be detected, and adjust the spectral data of the micro light-emitting diode 21 to be detected in this orientation to the spectral data of the corresponding standard orientation. The spectral data of the standard orientation is the corrected spectral data of the micro light-emitting diode 21 to be detected.

After completing the correction on the spectral data, as an optional implementation, the control module 41 determines dominant wavelengths corresponding to the spectral data of the plurality of micro light-emitting diodes 21 based on the corrected spectral data of the micro light-emitting diodes, and determines dominant wavelength differences for the plurality of micro light-emitting diodes 21 to be detected by comparing the plurality of dominant wavelengths with a preset dominant wavelength, respectively. Then, the control module 41 determines brightness values of the plurality of micro light-emitting diodes 21 to be detected based on the image data frame.

Specifically, the control module 41 calculates the image data frame using a brightness response value of a pixel, to obtain the brightness values of different micro light-emitting diodes 21 to be detected.

Furthermore, the control module 41 may determine brightness differences for the plurality of micro light-emitting diodes 21 to be detected by comparing the plurality of brightness values with a preset brightness value, respectively, and determine whether each of the micro light-emitting diodes 21 to be detected has an appearance defect by identifying the image data frame using a machine vision defect recognition algorithm. Finally, the micro light-emitting diode 21 to be detected that satisfies at least one of that the dominant wavelength difference is greater than a preset dominant wavelength threshold, that the brightness difference is greater than a preset brightness threshold, or that there is the appearance defect is marked as the defective micro light-emitting diode, and the position information corresponding to the identification point information of the defective micro light-emitting diode is determined.

In the spectrum detection method of the present disclosure, a corresponding peak wavelength may also be determined based on the spectral data, and it is determined whether the micro light-emitting diode has a defect based on the peak wavelength. In some embodiments, the control module 41 determines peak wavelengths of the spectra corresponding to the plurality of micro light-emitting diodes 21 based on the corrected spectral data of the micro light-emitting diodes, and determines peak wavelength differences for the plurality of micro light-emitting diodes 21 to be detected by comparing the plurality of peak wavelengths with a preset peak wavelength. Then, the control module 41 determines the brightness values of the plurality of micro light-emitting diodes 21 to be detected based on the image data frame.

Specifically, the control module 41 calculates the image data frame using the brightness response value of the pixel, to obtain the brightness values of different micro light-emitting diodes 21 to be detected.

Furthermore, the control module 41 may determine brightness differences for the plurality of micro light-emitting diodes 21 to be detected by comparing the plurality of brightness values with a preset brightness value, respectively, and determine whether each of the micro light-emitting diodes 21 to be detected has an appearance defect by identifying the image data frame using a machine vision defect recognition algorithm. Finally, the micro light-emitting diode 21 to be detected that satisfies at least one of that the dominant wavelength difference is greater than a preset dominant wavelength threshold, that the brightness difference is greater than a preset brightness threshold, or that there is the appearance defect is marked as the defective micro light-emitting diode, and the position information corresponding to the identification point information of the defective micro light-emitting diode is determined.

It should be noted that the above determination method requires both the dominant wavelength difference comparison and the brightness difference comparison, or both the peak wavelength difference comparison and the brightness difference comparison. However, it requires a large amount of work to perform both the dominant wavelength difference comparison and the brightness difference comparison, or both the peak wavelength difference comparison and the brightness difference comparison.

Therefore, in some embodiments, the control module 41 may detect the micro light-emitting diodes to be detected using the following detection method, to determine the defective micro light-emitting diode. The control module 41 may calculate the image data of the plurality of micro light-emitting diodes 21 to be detected in the image data frame using the brightness response value of the pixel, to obtain the brightness values of different micro light-emitting diodes 21 to be detected. Further, the brightness value of the micro light-emitting diode 21 to be detected is compared with the preset brightness value to obtain the brightness difference, and then it is determined whether the brightness difference is within a preset range.

If the brightness difference is not within of the preset range, the micro light-emitting diode 21 to be detected is marked as the defective micro light-emitting diode.

In some embodiments, if the brightness difference is within the preset range, the image data frame may be identified using the machine vision defect recognition algorithm, to determine whether each of the micro light-emitting diodes 21 to be detected has the appearance defect. If there is the appearance defect, the micro light-emitting diode 21 to be detected is marked as the defective micro light-emitting diode.

In some embodiments, if there is no appearance defect, the spectral data of each of the micro light-emitting diodes 21 to be detected may be determined based on the spectral imaging frame, and it is determined whether a PL spectrum of the micro light-emitting diode 21 to be detected is abnormal using a convolutional neural network algorithm. If the PL spectrum of the micro light-emitting diode 21 to be detected is abnormal, this micro light-emitting diode 21 to be detected is marked as the defective micro light-emitting diode, and the position information of the defective micro light-emitting diode corresponding to the identification point is determined based on the identification point information.

In this embodiment, by using the hyperspectral camera 31 to acquire the image data of the micro light-emitting diode 21 to be detected, the brightness defect and the appearance defect of the micro light-emitting diode to be detected are further determined. Therefore, the micro light-emitting diode may be detected from more dimensions, thereby improving the accuracy of detecting defective micro light-emitting diode.

In some embodiments, as shown in FIG. 2, the detection system further includes a first semi-transparent and semi-reflective mirror 71 placed between the high-magnification microscope objective and the hyperspectral camera.

Based on the above embodiments, a specific implementation of the present disclosure is provided based on FIG. 2. After the system is started, the first laser emitter 111 emits a laser light to the micro light-emitting diode 21 to be detected. The laser light is condensed by the first condenser lens 112, and expanded by the first beam expander (not shown in the figure), and then emitted to the first semi-transparent and semi-reflective mirror 71. The first semi-transparent and semi-reflective mirror 71 reflects a part of the laser to the micro light-emitting diode 21 to be detected. The micro light-emitting diode 21 to be detected starts to emit light after absorbing the light energy in the laser, and the light of the micro light-emitting diode 21 to be detected is transmitted through the first semi-transparent and semi-reflective mirror 71 passing through the high-magnification microscope objective, and emitted to the hyperspectral camera 31. In this case, the hyperspectral camera 31 acquires the spectral data and the image data of the plurality of micro light-emitting diodes 21 to be detected. The control module 41 processes the image data using the brightness response value of the pixel, to obtain a luminous intensity of the micro light-emitting diode to be detected, and compares the plurality of brightness values with the preset brightness value, respectively, to obtain the brightness differences. Then, it is determined whether the brightness difference is greater than the preset brightness threshold. For example, the brightness value of a first micro light-emitting diode to be detected is 11 cd, the brightness value of a second micro light-emitting diode to be detected is 12 cd, and the preset brightness value is 10 cd. In this case, the brightness difference for the first micro light-emitting diode to be detected is 1 cd, and the brightness difference for the second micro light-emitting diode to be detected is 2 cd. The preset brightness difference is within the range of −1 cd to 1 cd. In this case, the brightness difference for the second micro light-emitting diode to be detected exceeds the preset range, so the second micro light-emitting diode to be detected is marked as the defective micro light-emitting diode. Further, the image data of the first micro light-emitting diode to be detected is analyzed using the machine vision defect recognition algorithm, to determine whether there is an appearance defect. If there is no appearance defect, the spectral data in the spectral imaging frame is corrected using a mark point in the image data, and then a peak-finding processing is performed on the corrected spectral data of the micro light-emitting diode to be detected, to obtain the dominant wavelength corresponding to the spectrum of the micro light-emitting diode to be detected. Further, a plurality of dominant wavelengths are compared with the preset dominant wavelength, respectively, to determine dominant wavelength differences for the plurality of micro light-emitting diodes 21 to be detected, and determine whether the dominant wavelength difference is greater than the preset dominant wavelength threshold. For example, the dominant wavelength of the spectral data of the first micro light-emitting diode to be detected is 452 nm. The preset dominant wavelength is 450 nm, and the preset dominant wavelength difference is within the range of −1 nm to 1 nm. In this case, the dominant wavelength difference between the dominant wavelength of the first micro light-emitting diode to be detected and the preset dominant wavelength is 2 nm, which is not within of the preset range, so the first micro light-emitting diode to be detected is marked as the defective micro light-emitting diode.

Figure 4:
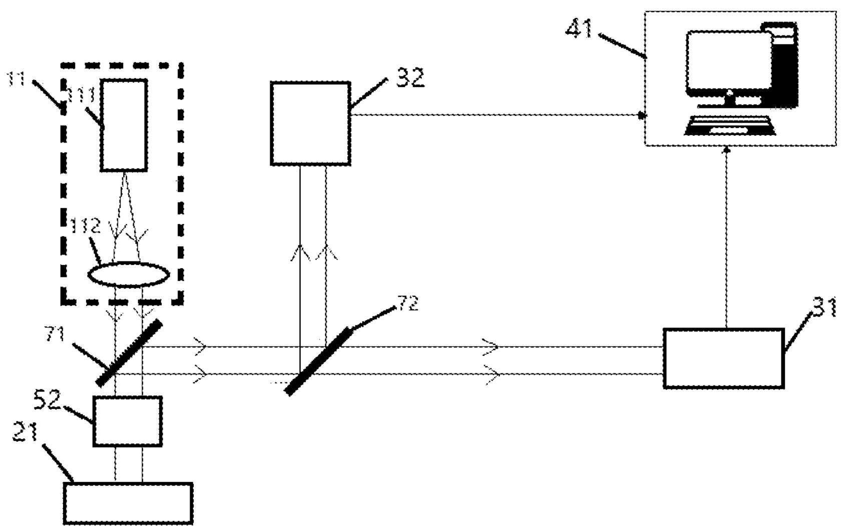
FIG. 4 is a schematic diagram illustrating a configuration of a micro light-emitting diode detection system according to a third embodiment of the present disclosure.

Based on the above second embodiment, since the pixels of the traditional hyperspectral camera generally have a linear array of about 1,000, and the observation field of view becomes smaller using the high-magnification microscope objective 51, the number of detected micro light-emitting diodes decreases. In order to avoid this situation, based on the above-mentioned the first embodiment, a third embodiment of the present disclosure provides a micro light-emitting diode detection system. As an optional embodiment, referring to FIG. 4, FIG. 4 is a schematic diagram illustrating a configuration of a micro light-emitting diode detection system according to the third embodiment of the present disclosure.

In this embodiment, the system further includes a microscope objective 52, and a charge-coupled device camera 32 connected to the control module 41.

The charge-coupled device camera 32 is configured to acquire the second light signals passing through the microscope objective 52, and obtain an image data frame based on the second light signals. The image data frame includes identification point information of the plurality of micro light-emitting diodes to be detected.

It can be understood that the charge-coupled device camera 32 may have a very high resolution, and the charge-coupled device camera 32 may be configured to obtain an image data frame of the micro light-emitting diode 21 to be detected that meets the requirements.

The identification point information includes position information of the micro light-emitting diode to be detected.

It can be understood that since the magnification of the microscope objective 52 is relatively low, the hyperspectral camera 31 may acquire more spectral data of the micro light-emitting diode 21 to be detected. However, due to the low resolution of the hyperspectral camera 31, the image data acquired by the hyperspectral camera 31 is not clear enough. In this embodiment, the charge-coupled device camera 32 (CCD camera) is configured to acquire the image data frame of the micro light-emitting diode 21 to be detected. On the basis of ensuring the accuracy of detection, the detection efficiency may be improved.

The control module 41 is further configured to determine, based on the image data frame, the defective micro light-emitting diode from the plurality of micro light-emitting diodes 21 to be detected and the position information of the defective micro light-emitting diode.

Specifically, in some embodiments, the control module 41 may detect the micro light-emitting diode to be detected using the following detection method, to determine the defective micro light-emitting diode.

The control module 41 may correct the spectral data in the spectral imaging frame based on the identification point.

It can be understood that the spectral data emitted by the micro light-emitting diode 21 in different orientations will be different. In order to make the detection results more accurate, specifically, the control module 41 determines an orientation of the current micro light-emitting diode to be detected by identifying the identification point on the micro light-emitting diode 21 to be detected, and adjusts the spectral data of the micro light-emitting diode 21 to be detected in this orientation to the spectral data of the corresponding standard orientation. The spectral data of the standard orientation is the corrected spectral data of the micro light-emitting diode 21 to be detected.

After completing the correction on the spectral data, the control module 41 determines dominant wavelengths corresponding to the spectral data of the plurality of micro light-emitting diodes 21 based on the corrected spectral data of the micro light-emitting diodes.

The control module 41 determines dominant wavelength differences for the plurality of micro light-emitting diodes 21 to be detected by comparing the plurality of dominant wavelengths with a preset dominant wavelength, respectively.

Then, the control module 41 determines brightness values of the plurality of micro light-emitting diodes 21 to be detected based on the image data frame.

Specifically, the control module 41 calculates the image data frame using a brightness response value of a pixel, to obtain the brightness values of different micro light-emitting diodes 21 to be detected.

Furthermore, the control module 41 may determine brightness differences for the plurality of micro light-emitting diodes 21 to be detected by comparing the plurality of brightness values with a preset brightness value, respectively, and determine whether each of the micro light-emitting diodes 21 to be detected has an appearance defect by identifying the image data frame using a machine vision defect recognition algorithm. Finally, the micro light-emitting diode 21 to be detected that satisfies at least one of that the dominant wavelength difference is greater than a preset dominant wavelength threshold, that the brightness difference is greater than a preset brightness threshold, or that there is the appearance defect is marked as the defective micro light-emitting diode, and the position information corresponding to the identification point information of the defective micro light-emitting diode is determined.

It should be noted that the above determination method requires both the dominant wavelength difference comparison and the brightness difference comparison. However, it requires a large amount of work to perform both the dominant wavelength difference comparison and the brightness difference comparison.

Therefore, as an optional implementation, the control module 41 may detect the micro light-emitting diodes to be detected using the following detection method, to determine the defective micro light-emitting diode. The control module 41 may calculate the image data of the plurality of micro light-emitting diodes 21 to be detected in the image data frame using the brightness response value of the pixel, to obtain the brightness values of different micro light-emitting diodes 21 to be detected. Further, the brightness value of the micro light-emitting diode 21 to be detected is compared with the preset brightness value to obtain the brightness difference, and then it is determined whether the brightness difference is within a preset range.

If the brightness difference is not within of the preset range, the micro light-emitting diode 21 to be detected is marked as the defective micro light-emitting diode.

In some embodiments, if the brightness difference is within the preset range, the image data frame may be identified using the machine vision defect recognition algorithm, to determine whether each of the micro light-emitting diodes 21 to be detected has the appearance defect. If there is the appearance defect, the micro light-emitting diode 21 to be detected is marked as the defective micro light-emitting diode.

In some embodiments, if there is no appearance defect, the spectral data of each of the micro light-emitting diodes 21 to be detected may be determined based on the spectral imaging frame, and it is determined whether a PL spectrum of the micro light-emitting diode 21 to be detected is abnormal using a convolutional neural network algorithm. If the PL spectrum of the micro light-emitting diode 21 to be detected is abnormal, this micro light-emitting diode 21 to be detected is marked as the defective micro light-emitting diode, and the position information of the defective micro light-emitting diode corresponding to the identification point is determined based on the identification point information.

In this embodiment, the system further includes a first semi-transparent and semi-reflective mirror 71 placed between the microscope objective 52 and the charge-coupled device camera 32, and a second semi-transparent and semi-reflective mirror 72 placed between the first semi-transparent and semi-reflective mirror 71 and the hyperspectral camera 31.

The first light generating module 11 is configured to emit a first light beam to the plurality of micro light-emitting diodes 21 to be detected through the first semi-transparent and semi-reflective mirror 71, such that the plurality of micro light-emitting diodes 21 to be detected generate second light beams.

The second light beams are reflected to, after the second light beams are emitted to the first semi-transparent and semi-reflective mirror 71 through the microscope objective 52, the second semi-transparent and semi-reflective mirror 72 through the first semi-transparent and semi-reflective mirror 71. A part of the second light beams is reflected to the charge-coupled device camera 32 through the second semi-transparent and semi-reflective mirror 72, such that the charge-coupled device camera 32 acquires the part of the second light beams, to obtain the image data frame.

A remaining part of the second light beams is transmitted from the second semi-transparent and semi-reflective mirror 72 to the hyperspectral camera 31, such that the hyperspectral camera 31 acquires the remaining part of the second light beams, to obtain the spectral imaging frame.

In this embodiment, the charge-coupled device camera 32 may be used to acquire the image data of the micro light-emitting diode 21, and the charge-coupled device camera 32 may directly acquire clear image data of the micro light-emitting diode 21 without using the high-magnification microscope objective 51. Only the size of the magnified micro light-emitting diode is close to the resolution of the hyperspectral camera, the detection of the defective micro light-emitting diode may be completed. Therefore, in this embodiment, the high-magnification microscope objective 51 may be replaced with the microscope objective 52. It can be understood that since the magnification of the microscope objective 52 is smaller, more spectral data and image data of the micro light-emitting diode may be acquired, thereby improving the efficiency of acquisition.

Based on the above embodiments, a specific implementation is provided based on FIG. 4. After the system is started, the first laser emitter 111 emits a laser light that is condensed by the first condenser lens 112, and expanded by the first beam expander (not shown in the figure), then the first light beam is transmitted through the first semi-transparent and semi-reflective mirror 71, and emitted to the plurality of the micro light-emitting diodes 21 to be detected. The micro light-emitting diode 21 to be detected starts to emit light after absorbing the light energy in the laser, and the light of the micro light-emitting diode 21 to be detected is transmitted through the first semi-transparent and semi-reflective mirror 71 passing through the microscope objective 52, and emitted to the second semi-transparent and semi-reflective mirror 72. A part of the second light beams is reflected to the charge-coupled device camera 32 through the second semi-transparent and semi-reflective mirror 72, such that the charge-coupled device camera 32 acquires the part of the second light beams to obtain the image data frame. A remaining part of the second light beams is transmitted from the second semi-transparent and semi-reflective mirror 72 to the hyperspectral camera 31, such that the hyperspectral camera 31 acquires the remaining part of the second light beams. The control module 41 processes the image data using the brightness response value of the pixel, to obtain a luminous intensity of the micro light-emitting diode to be detected, and compares the plurality of brightness values with the preset brightness value, respectively, to obtain the brightness differences. Then, it is determined whether the brightness difference is greater than the preset brightness threshold. For example, the brightness value of a first micro light-emitting diode to be detected is 11 cd, the brightness value of a second micro light-emitting diode to be detected is 12 cd, and the preset brightness value is 10 cd. In this case, the brightness difference for the first micro light-emitting diode to be detected is 1 cd, and the brightness difference for the second micro light-emitting diode to be detected is 2 cd. The preset brightness difference is within the range of −1 cd to 1 cd. In this case, the brightness difference for the second micro light-emitting diode to be detected exceeds the preset range, so the second micro light-emitting diode to be detected is marked as the defective micro light-emitting diode. Further, the image data of the first micro light-emitting diode to be detected is analyzed using the machine vision defect recognition algorithm, to determine whether there is an appearance defect. If there is no appearance defect, the spectral data in the spectral imaging frame is corrected using a mark point in the image data, and then a peak-finding processing is performed on the corrected spectral data of the micro light-emitting diode to be detected, to obtain the dominant wavelength corresponding to the spectrum of the micro light-emitting diode to be detected. Further, a plurality of dominant wavelengths are compared with the preset dominant wavelength, respectively, to determine dominant wavelength differences for the plurality of micro light-emitting diodes 21 to be detected, and determine whether the dominant wavelength difference is greater than the preset dominant wavelength threshold. For example, the dominant wavelength of the spectral data of the first micro light-emitting diode to be detected is 452 nm. The preset dominant wavelength is 450 nm, and the preset dominant wavelength difference is within the range of −1 nm to 1 nm. In this case, the dominant wavelength difference between the dominant wavelength of the first micro light-emitting diode to be detected and the preset dominant wavelength is 2 nm, which is not within of the preset range, so the first micro light-emitting diode to be detected is marked as the defective micro light-emitting diode, and the position information of the defective micro light-emitting diode is determined based on the identification point information of the defective micro light-emitting diode.

Figure 5:
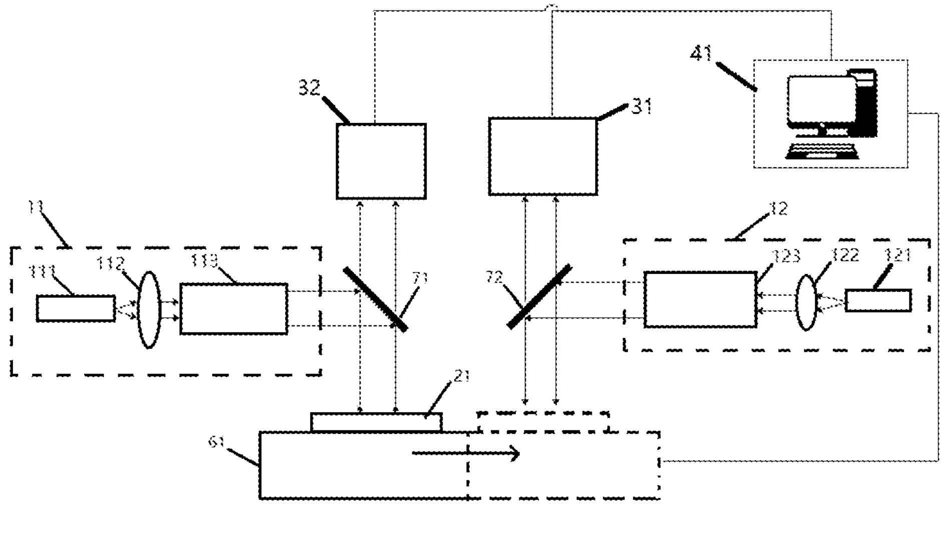
FIG. 5 is a schematic diagram illustrating a configuration of a micro light-emitting diode detection system according to a fourth embodiment of the present disclosure.

This disclosure provides another embodiment of a micro light-emitting diode detection system. Referring to FIG. 5, FIG. 5 is a schematic diagram illustrating a configuration of a micro light-emitting diode detection system according to a fourth embodiment of the present disclosure.

In this embodiment, the system further includes a second light generating module 12, a charge-coupled device camera 32, and a carrier module 61 connected to the hyperspectral camera 31 and the charge-coupled device camera 32, respectively. A spatial resolution of the hyperspectral camera 31 is close to the size of the micro light-emitting diode 21 to be detected.

The second light generating module 12 is configured to send a third light signal to the plurality of micro light-emitting diodes 21 to be detected.

It should be noted that the configuration of the second light generating module 12 may refer to the configuration of the above-mentioned first light generating module, and will not be described again here.

The carrier module 61 is configured to place the plurality of micro light-emitting diodes 21 to be detected, and movable between a first position and a second position. At the first position, the plurality of micro light-emitting diodes 21 to be detected receive the first light signal emitted by the first light generating module 11, and generate the second light signals.

It can be understood that when the spatial resolution of the hyperspectral camera 31 is close to the size of the micro light-emitting diode, accurate spectral data may be acquired. In this embodiment, two different light generating modules are respectively used to improve the accuracy of acquiring the image data and the spectral data, thereby achieving the accuracy of detecting the defective micro light-emitting diode.

It should be noted that, in this embodiment, the first light signal may include a light signal in a blue light band.

The charge-coupled device camera 32 is configured to acquire the second light signals, and obtain an image data frame based on the second light signals.

The control module 41 is further configured to send a control instruction to the carrier module 61 after receiving the image data frame, such that the carrier module 61 moves from the first position to the second position.

At the second position, the plurality of micro light-emitting diodes 21 to be detected receive the third light signal emitted by the second light generating module 12, and generate fourth light signals.

In this embodiment, the third light signal may include a light signal in a normal photoexcitation band.

The hyperspectral camera 31 is configured to acquire the fourth light signals, to obtain the spectral imaging frame. The spectral imaging frame includes the spectral data of the plurality of micro light-emitting diodes 21 to be detected.

Specifically, in some embodiments, the control module 41 may detect the micro light-emitting diode 21 to be detected using the following detection method, to determine the defective micro light-emitting diode. After receiving the image data frame, the control module 41 may calculate the brightness values of different micro light-emitting diodes 21 to be detected based on the image data frame using the brightness response value of the pixel. Further, the brightness value of the micro light-emitting diode 21 to be detected is compared with the preset brightness value to obtain the brightness difference, and then it is determined whether the brightness difference is within a preset range. If the brightness difference is not within of the preset range, the micro light-emitting diode 21 to be detected is marked as the defective micro light-emitting diode. If the brightness difference is within the preset range, the image data frame may be identified using the machine vision defect recognition algorithm, to determine whether each of the micro light-emitting diodes 21 to be detected has the appearance defect. If there is the appearance defect, the micro light-emitting diode 21 to be detected is marked as the defective micro light-emitting diode. if there is no appearance defect, the control instruction is sent to the carrier module 61, such that the carrier module 61 moves to the second position, and the control module 41 acquires the spectral imaging frame through the hyperspectral camera 31.

The control module 41 may correct the spectral data in the spectral imaging frame based on the identification point information in the image data frame.

It can be understood that the spectral data emitted by the micro light-emitting diode 21 in different orientations will be different. In order to make the detection results more accurate, specifically, the control module 41 determines an orientation of the current micro light-emitting diode to be detected by identifying the identification point on the micro light-emitting diode 21 to be detected, and adjust the spectral data of the micro light-emitting diode 21 to be detected in this orientation to the spectral data of the corresponding standard orientation. The spectral data of the standard orientation is the corrected spectral data of the micro light-emitting diode 21 to be detected.

After completing the correction on the spectral data, the control module 41 determines dominant wavelengths corresponding to the spectral data of the plurality of micro light-emitting diodes 21 based on the corrected spectral data of the micro light-emitting diodes, and determines dominant wavelength differences for the plurality of micro light-emitting diodes 21 to be detected by comparing the plurality of dominant wavelengths with a preset dominant wavelength, respectively.

Then, the control module 41 determines brightness values of the plurality of micro light-emitting diodes 21 to be detected based on the image data frame.

Specifically, the control module 41 calculates the image data frame using a brightness response value of a pixel, to obtain the brightness values of different micro light-emitting diodes 21 to be detected.

Furthermore, brightness differences for the plurality of micro light-emitting diodes 21 to be detected are determined by comparing the plurality of brightness values with a preset brightness value, respectively.

In some embodiments, it is determined whether each of the micro light-emitting diodes 21 to be detected has an appearance defect by identifying the image data frame using a machine vision defect recognition algorithm.

The micro light-emitting diode 21 to be detected that satisfies at least one of that the dominant wavelength difference is greater than a preset dominant wavelength threshold, that the brightness difference is greater than a preset brightness threshold, or that there is the appearance defect is marked as the defective micro light-emitting diode, and the position information corresponding to the identification point information of the defective micro light-emitting diode is determined.

As an optional implementation, the detection method may include the following steps. After acquiring the image data frame, the control module 41 sends the control instruction to the carrier module 61, such that the carrier module 61 moves to the second position, and acquires the spectral imaging frame through the hyperspectral camera 31.

The control module 41 may correct the spectral data in the spectral imaging frame based on the identification point, and determine dominant wavelengths corresponding to the spectral data of the plurality of micro light-emitting diodes based on the corrected spectral data of the micro light-emitting diodes.

The control module 41 determines dominant wavelength differences for the plurality of micro light-emitting diodes by comparing the plurality of dominant wavelengths with a preset dominant wavelength, respectively.

Then, the control module 41 determines brightness values of the plurality of micro light-emitting diodes based on the image data frame.

Specifically, the control module 41 calculates the image data frame using a brightness response value of a pixel, to obtain the brightness values of different micro light-emitting diodes 21 to be detected.

Furthermore, the control module 41 determines brightness differences for the plurality of micro light-emitting diodes by comparing the plurality of brightness values with a preset brightness value, respectively.

The control module 41 determines whether each of the micro light-emitting diodes 21 to be detected has an appearance defect by identifying the image data frame using a machine vision defect recognition algorithm.

The micro light-emitting diode 21 to be detected that satisfies at least one of that the dominant wavelength difference is greater than a preset dominant wavelength threshold, that the brightness difference is greater than a preset brightness threshold, or that there is the appearance defect is marked as the defective micro light-emitting diode, and the position information corresponding to the identification point information of the defective micro light-emitting diode is determined.

It should be noted that, in this embodiment, the system further includes a first semi-transparent and semi-reflective mirror 71 placed between the carrier module 61 and the charge-coupled device camera 32, and a second semi-transparent and semi-reflective mirror 72 placed between the carrier module 61 and the hyperspectral camera 31.

The first light generating module 11 is configured to reflect, at the first position, a first light beam to the plurality of micro light-emitting diodes 21 to be detected through the first semi-transparent and semi-reflective mirror 71, such that the plurality of micro light-emitting diodes 21 to be detected generate second light beams.

The second light beams are emitted to the first semi-transparent and semi-reflective mirror 71, and the second light beams are transmitted from the first semi-transparent and semi-reflective mirror 71 to the charge-coupled device camera 32, such that the charge-coupled device camera 32 acquires the second light beams, to obtain the image data frame.

The second light generating module is configured to reflect, at the second position, a third light beam to the plurality of micro light-emitting diodes 21 to be detected through the second semi-transparent and semi-reflective mirror 72, such that the plurality of micro light-emitting diodes 21 to be detected generate fourth light beams.

The fourth light beams are emitted to the second semi-transparent and semi-reflective mirror 72, and the fourth light beams are transmitted from the second semi-transparent and semi-reflective mirror 72 to the hyperspectral camera 31, such that the hyperspectral camera 31 acquires the fourth light beams, to obtain the spectral imaging frame.

In this embodiment, by using the movable carrier module 61, the charge-coupled device camera 32 only acquires the second light signals at the first position, and the hyperspectral camera 31 only acquires the fourth light signals at the second position, thereby ensuring that the charge-coupled device camera 32 and the hyperspectral camera 31 respectively acquire different light signals emitted by the micro light-emitting diode 21 to be detected under different light sources.

In this embodiment, an optical path through which the charge-coupled device camera 32 acquires the image data frame may be separated from an optical path through which the hyperspectral camera 31 acquires the spectral imaging frame. In this case, since the resolution of the hyperspectral camera 31 is close to the size of the micro light-emitting diode, the size of the micro light-emitting diode is enlarged without using the microscope objective. More clear image data of the micro light-emitting diode may be acquired using directly the charge-coupled device camera 32, and then it is quickly detected whether more micro light-emitting diodes have the brightness defect or the appearance defect, thereby improving the detection efficiency of the defective micro light-emitting diode.

Based on the above embodiments, a specific implementation is provided based on FIG. 4. After the system is started, the first laser emitter 111 emits a laser light that is condensed by the first condenser lens 112, and expanded by the first beam expander 113, then the first light beam is reflected through the first semi-transparent and semi-reflective mirror 71 to the plurality of micro light-emitting diodes 21 to be detected. The micro light-emitting diodes 21 to be detected start to emit light after absorbing the light energy in the laser, to generate second light beams. The second light beams are transmitted from the first semi-transparent and semi-reflective mirror 71 to the charge-coupled device camera 32, such that the charge-coupled device camera 32 acquires the second light beams to obtain the image data frame. After acquiring the image data frame, the control module 41 sends the control instruction to the carrier module 61, such that the carrier module 61 moves to the second position. At the second position, the second laser emitter 121 emits a laser light that is condensed by the second condenser lens 122, and expanded by the second beam expander 123, then the first light beam is transmitted through the second semi-transparent and semi-reflective mirror 72 to the plurality of micro light-emitting diodes 21 to be detected, so that the plurality of micro light-emitting diodes 21 to be detected emit light after absorbing the light energy in the laser, to generate fourth light beams. The fourth light beams are emitted to the second semi-transparent and semi-reflective mirror 72, and transmitted from the second semi-transparent and semi-reflective mirror 72 to the hyperspectral camera 31, such that the hyperspectral camera 31 acquires the fourth light beams, to obtain the spectral imaging frame. The control module 41 processes the image data using the brightness response value of the pixel, to obtain a luminous intensity of the micro light-emitting diode to be detected, and compares the plurality of brightness values with the preset brightness value, respectively, to obtain the brightness differences. Then, it is determined whether the brightness difference is greater than the preset brightness threshold. For example, the brightness value of a first micro light-emitting diode to be detected is 11 cd, the brightness value of a second micro light-emitting diode to be detected is 12 cd, and the preset brightness value is 10 cd. In this case, the brightness difference for the first micro light-emitting diode to be detected is 1 cd, and the brightness difference for the second micro light-emitting diode to be detected is 2 cd. The preset brightness difference is within the range of −1 cd to 1 cd. In this case, the brightness difference for the second micro light-emitting diode to be detected exceeds the preset range, so the second micro light-emitting diode to be detected is marked as the defective micro light-emitting diode. Further, the image data of the first micro light-emitting diode to be detected is analyzed using the machine vision defect recognition algorithm, to determine whether there is an appearance defect. If there is no appearance defect, the spectral data in the spectral imaging frame is corrected using a mark point in the image data, and then a peak-finding processing is performed on the corrected spectral data of the micro light-emitting diode to be detected, to obtain the dominant wavelength corresponding to the spectrum of the micro light-emitting diode to be detected. Further, a plurality of dominant wavelengths are compared with the preset dominant wavelength, respectively, to determine dominant wavelength differences for the plurality of micro light-emitting diodes 21 to be detected, and determine whether the dominant wavelength difference is greater than the preset dominant wavelength threshold. For example, the dominant wavelength of the spectral data of the first micro light-emitting diode to be detected is 452 nm. The preset dominant wavelength is 450 nm, and the preset dominant wavelength difference is within the range of −1 nm to 1 nm. In this case, the dominant wavelength difference between the dominant wavelength of the first micro light-emitting diode to be detected and the preset dominant wavelength is 2 nm, which is not within of the preset range, so the first micro light-emitting diode to be detected is marked as the defective micro light-emitting diode, and the position information of the defective micro light-emitting diode is determined based on the identification point information of the defective micro light-emitting diode.

Figure 6:
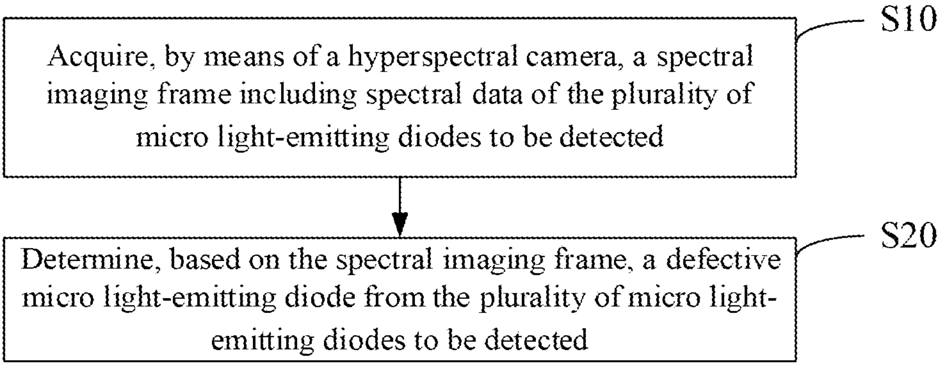
FIG. 6 is a flow diagram illustrating a micro light-emitting diode detection method according to a first embodiment of the present disclosure.

In addition, based on the above embodiments of the system, the present disclosure also provides a micro light-emitting diode detection method. Referring to FIG. 6, FIG. 6 is a flow diagram illustrating a micro light-emitting diode detection method according to a first embodiment of the present disclosure. In this embodiment, the method includes step S10 and step S20.

In step S10, a spectral imaging frame is acquired using a hyperspectral camera. The spectral imaging frame includes spectral data of the plurality of micro light-emitting diodes to be detected.

In step S20, a defective micro light-emitting diode is determined from the plurality of micro light-emitting diodes to be detected based on the spectral imaging frame.

The detection method is the detection method applied in the first embodiment of the above-mentioned system. The specific implementations may be referred to the above-mentioned embodiments of the system, which will not be described again in this embodiment.

In this embodiment, the spectral imaging frame is acquired using the hyperspectral camera. The spectral imaging frame includes spectral data of the plurality of micro light-emitting diodes to be detected. Then, the defective micro light-emitting diode is determined from the plurality of micro light-emitting diodes to be detected based on the spectral imaging frame.

Since the resolution of the hyperspectral camera can be smaller than or close to the size of the micro light-emitting diode, the present disclosure can simultaneously acquire the light signals of the plurality of micro light-emitting diodes to be detected through the hyperspectral camera, to obtain the spectral imaging frame. The spectral imaging frame includes spectral data of the plurality of micro light-emitting diodes to be detected. The spectral data of each of the micro light-emitting diodes to be detected in the spectral imaging frame is analyzed to achieve accurate detection of the plurality of micro light-emitting diodes at the same time, which improves the detection efficiency of micro light-emitting diodes in production.

Based on the above first embodiment of the micro light-emitting diode detection method, a second embodiment of the present disclosure provides a micro light-emitting diode detection method. In this embodiment, after step S10, the method further includes step S11.

In step S11, an image data frame is acquired using a charge-coupled device camera. The image data frame includes identification point information of the plurality of micro light-emitting diodes to be detected, and the identification point information includes position information of the micro light-emitting diode to be detected.

The step S20 specifically includes step S21.

In step S21, based on the spectral imaging frame and the image data frame, the defective micro light-emitting diode is determined from the plurality of micro light-emitting diodes to be detected, and the position information of the defective micro light-emitting diode is determined.

Based on the above second embodiment of the micro light-emitting diode detection method, a third embodiment of the present disclosure provides a micro light-emitting diode detection method. In this embodiment, the step S21 specifically includes steps S211 to S215.

In step S211, dominant wavelengths corresponding to the plurality of spectral data of the plurality of micro light-emitting diodes are determined based on the spectral imaging frame.

In step S212, by comparing each of the plurality of dominant wavelengths with a preset dominant wavelength, respectively, dominant wavelength differences for the plurality of micro light-emitting diodes are determined.

In step S213, brightness values of the plurality of micro light-emitting diodes are determined based on the image data frame.

In step S214, by comparing the plurality of brightness values with a preset brightness value, respectively, brightness differences for the plurality of micro light-emitting diodes are determined.

In step S215, a micro light-emitting diode to be detected that satisfies that the dominant wavelength difference is greater than a preset dominant wavelength threshold, and/or that the brightness difference is greater than a preset brightness threshold is determined as the defective micro light-emitting diode, and the position information of corresponding to the identification point information of the defective micro light-emitting diode is determined.

It should be noted that, the detection method is the detection method corresponding to the above second embodiment of the system. The specific implementations may be referred to the above-mentioned embodiments of the system, which will not be described again in this embodiment.

The above are only preferred embodiments of the present disclosure, and are not intended to limit the patent scope of the present disclosure. Any equivalent structure or equivalent process transformation made using the description and drawings of the present disclosure, or directly or indirectly applied to other related technologies fields are equally included in the scope of patent protection of this disclosure.

The invention claimed is:

1. A micro light-emitting diode detection system, comprising:

- a carrier module movable between a first position and a second position, a plurality of micro light-emitting diodes to be detected being placed on the carrier module;
- a first light generating module configured to send, when the carrier module is at the first position, a first light signal to the plurality of micro light-emitting diodes to be detected, such that the plurality of micro light-emitting diodes to be detected generate second light signals;
- a charge-coupled device camera configured to acquire the second light signals, and obtain, based on the second light signals, an image data frame;
- a second light generating module configured to send, when the carrier module is at the second position, a third light signal to the plurality of micro light-emitting diodes to be detected, such that the plurality of micro light-emitting diodes to be detected generate fourth light signals;
- a hyperspectral camera configured to acquire the fourth light signals, and obtain, based on the fourth light signals, a spectral imaging frame including spectral data of each of the plurality of micro light-emitting diodes to be detected, wherein a spatial resolution of the hyperspectral camera is less than or close to a size of the micro light-emitting diode to be detected; and a control module connected to both the charge-coupled device camera and the hyperspectral camera, and configured to:

send, after receiving the image data frame, a control instruction to the carrier module, such that the carrier module moves from the first position to the second position; and determine, based on the image data frame and the spectral imaging frame, a defective micro light-emitting diode from the plurality of micro light-emitting diodes to be detected and the position information of the defective micro light-emitting diode.

2. The micro light-emitting diode detection system of claim 1, further comprising:

a first semi-transparent and semi-reflective mirror placed between the carrier module and the charge-coupled device camera, and a second semi-transparent and semi-reflective mirror placed between the carrier module and the hyperspectral camera, the first light generating module configured to reflect, at the first position, a first light beam to the plurality of micro light-emitting diodes to be detected through the first semi-transparent and semi-reflective mirror, such that the plurality of micro light-emitting diodes to be detected acquire, based on the first light beam, the first light signal, and generate second light beams, wherein the second light beams are emitted to the first semi-transparent and semi-reflective mirror, and the second light beams are transmitted from the first semi-transparent and semi-reflective mirror to the charge-coupled device camera, such that the charge-coupled device camera acquires, based on the second light beams, the second light signals, to obtain the image data frame;

the second light generating module is configured to reflect, at the second position, a third light beam to the plurality of micro light-emitting diodes to be detected through the second semi-transparent and semi-reflective mirror, such that the plurality of micro light-emitting diodes to be detected acquire, based on the third light beam, a third light signal, and generate fourth light beams, and the fourth light beams are emitted to the second semi-transparent and semi-reflective mirror, and the fourth light beams are transmitted from the second semi-transparent and semi-reflective mirror to the hyperspectral camera, such that the hyperspectral camera acquires, based on the fourth light beams, the fourth light signals, to obtain the spectral imaging frame.

3. The micro light-emitting diode detection system of claim 1, wherein the control module is configured to:

determine, based on the spectral imaging frame, a plurality of dominant wavelengths corresponding to the spectral data of the plurality of micro light-emitting diodes to be detected;

determine, by comparing the plurality of dominant wavelengths with a preset dominant wavelength, respectively, a plurality of dominant wavelength differences for the plurality of micro light-emitting diodes to be detected;

determine, based on the image data frame, a plurality of brightness values of the plurality of micro light-emitting diodes to be detected;

determine, by comparing the plurality of brightness values with a preset brightness value, respectively, a plurality of brightness differences for the plurality of micro light-emitting diodes to be detected;

determine, based on the image data frame, whether there is an appearance defect in the plurality of micro light-emitting diodes to be detected; and determine, as the defective micro light-emitting diode, a micro light-emitting diode to be detected that satisfies at least one of that the dominant wavelength difference is greater than a preset dominant wavelength threshold, that the brightness difference is greater than a preset brightness threshold, or that there is the appearance defect, and determine the position information of the defective micro light-emitting diode corresponding to the identification point information of the defective micro light-emitting diode.

4. The micro light-emitting diode detection system of claim 1, wherein the first light generating module includes a first laser emitter, and wherein a first condenser lens is coupled in front of an emission port of the first laser emitter, and a first beam expander is coupled behind the first condenser lens.

5. The micro light-emitting diode detection system of claim 1, wherein the second light generating module includes a second laser emitter, and the third light signal includes a laser signal, and wherein a second condenser lens is coupled in front of an emission port of the second laser emitter, and a second beam expander is coupled behind the second condenser lens.

6. The micro light-emitting diode detection system of claim 1, wherein the control module includes a device having a data processing function.

7. The micro light-emitting diode detection system of claim 1, wherein the control module is configured to acquire, based on the spectral imaging frame, a plurality of spectral data corresponding to the plurality of micro light-emitting diodes to be detected; perform integral conversion on each of the plurality of spectral data, to obtain a plurality of brightness values of the plurality of micro light-emitting diodes to be detected; compare each of the plurality of brightness values with a preset brightness value, to obtain a brightness difference; determine whether the brightness difference is within a preset range; mark, if the brightness difference is not within of the preset range, the corresponding micro light-emitting diode to be detected as the defective micro light-emitting diode; determine, if the brightness difference is within the preset range, whether the spectral data of the corresponding micro light-emitting diode to be detected is abnormal using a convolutional neural network model; mark, if the spectral data of the corresponding micro light-emitting diode to be detected is abnormal, the corresponding micro light-emitting diode to be detected as the defective micro light-emitting diode.

8. A micro light-emitting diode detection method, comprising:

sending, by a first light generating module, a first light signal to a plurality of micro light-emitting diodes to be detected placed on a carrier module at a first position, such that the plurality of micro light-emitting diodes to be detected generate second light signals;

acquiring, by a charge-coupled device camera, second light signals, and obtaining, based on the second light signals, an image data frame;

sending, after receiving the image data frame, a control instruction to the carrier module, such that the carrier module moves from the first position to a second position;

sending, by a second light generating module, a third light signal to the plurality of micro light-emitting diodes to be detected placed on the carrier module at the second position, such that the plurality of micro light-emitting diodes to be detected generate fourth light signals;

acquiring, by a hyperspectral camera, fourth light signals, and obtaining, a spectral imaging frame based on the fourth light signals, the spectral imaging frame including spectral data of each of the plurality of micro light-emitting diodes to be detected; and determining, based on the spectral imaging frame and the image data frame, a defective micro light-emitting diode from the plurality of micro light-emitting diodes to be detected and the position information of the defective micro light-emitting diode.

9. The micro light-emitting diode detection method of claim 8, wherein the image data frame includes identification point information of the plurality of micro light-emitting diodes to be detected, the identification point information including position information of the micro light-emitting diode to be detected.

10. The micro light-emitting diode detection method of claim 8, wherein the determining, based on the spectral imaging frame and the image data frame, the defective micro light-emitting diode from the plurality of micro light-emitting diodes to be detected and the position information of the defective micro light-emitting diode, comprises:

determining, based on the spectral imaging frame, a plurality of dominant wavelengths corresponding to the plurality of spectral data of the plurality of micro light-emitting diodes to be detected;

determining, by comparing each of the plurality of dominant wavelengths with a preset dominant wavelength, respectively, a plurality of dominant wavelength differences corresponding to the plurality of micro light-emitting diodes to be detected;

determining, based on the image data frame, a plurality of brightness values of the plurality of micro light-emitting diodes to be detected;

determine, by comparing each of the plurality of brightness values with a preset brightness value, respectively, a plurality of brightness differences corresponding to the plurality of micro light-emitting diodes to be detected;

determining, based on the image data frame, whether there is an appearance defect in the plurality of micro light-emitting diodes to be detected; and determining, as the defective micro light-emitting diode, a micro light-emitting diode to be detected that satisfies at least one of that the dominant wavelength difference is greater than a preset dominant wavelength threshold, that the brightness difference is greater than a preset brightness threshold, or that there is the appearance defect, and determining the position information of the defective micro light-emitting diode corresponding to the identification point information of the defective micro light-emitting diode.

* * * * *